(12) United States Patent
Kijima

(10) Patent No.: US 7,419,579 B2
(45) Date of Patent: Sep. 2, 2008

(54) METHOD FOR MANUFACTURING A FERROELECTRIC FILM

(75) Inventor: Takeshi Kijima, Matsumoto (JP)

(73) Assignee: Seiko Epson Corporation (JP)

( * ) Notice: Subject to any disclaimer, the term of this patent is extended or adjusted under 35 U.S.C. 154(b) by 539 days.

(21) Appl. No.: 11/085,603

(22) Filed: Mar. 21, 2005

(65) Prior Publication Data

US 2005/0208209 A1    Sep. 22, 2005

(30) Foreign Application Priority Data

Mar. 22, 2004  (JP) ............................. 2004-082543

(51) Int. Cl.
- C01B 13/32  (2006.01)
- C25D 13/02  (2006.01)
- C25D 13/04  (2006.01)
- C25D 5/50   (2006.01)

(52) U.S. Cl. ................. 205/112; 204/471; 204/484; 204/509; 205/224; 205/238; 205/333; 438/3

(58) Field of Classification Search .......... 205/90, 205/119, 112, 224, 238, 333; 204/450, 471, 204/484

See application file for complete search history.

(56) References Cited

U.S. PATENT DOCUMENTS

| | | | |
|---|---|---|---|
| 4,500,397 A | | 2/1985 | Mori |
| 5,427,678 A | * | 6/1995 | Yoshimura et al. .......... 205/322 |
| 6,479,406 B2 | * | 11/2002 | Gal-Or et al. .............. 438/785 |
| 7,056,750 B2 | | 6/2006 | Kijima |
| 2003/0203513 A1 | * | 10/2003 | Uchiyama et al. .............. 438/3 |
| 2005/0057884 A1 | | 3/2005 | Yamada et al. |

FOREIGN PATENT DOCUMENTS

| | | |
|---|---|---|
| JP | 58-18916 | 2/1983 |
| JP | 63-110681 | 5/1988 |
| JP | 63-277517 | 11/1988 |
| JP | 5-78103 | 3/1993 |
| JP | 6-305867 | 11/1994 |
| JP | 8-91841 | 4/1996 |
| JP | 10-102294 | 4/1998 |
| JP | 2000-150295 | 5/2000 |
| JP | 2000-244031 | 9/2000 |
| JP | 2002-275390 | 9/2002 |
| JP | 2005-75714 | 3/2005 |
| JP | 2005-123310 | 5/2005 |
| JP | 2005-126274 | 5/2005 |

OTHER PUBLICATIONS

Examination result issued in corresponding Japanese application, date unknown.

* cited by examiner

Primary Examiner—Susy Tsang-Foster
Assistant Examiner—William T Leader
(74) Attorney, Agent, or Firm—Harness, Dickey & Pierce, P.L.C.

(57) ABSTRACT

A method for manufacturing a ferroelectric film includes the steps of causing, in a solution containing sol-gel raw materials, hydrolysis and polycondensation to the sol-gel raw materials to form a liquid containing particulate gels dispersed therein, and forming a ferroelectric film by a migration electrodeposition method, using the liquid containing particulate gels, through electrodepositing the particulate gels on an electrode.

5 Claims, 5 Drawing Sheets

A—A

SOL-GEL PZT/DMS=65/35

60/40

50/50

METHOD FOR MANUFACTURING A FERROELECTRIC FILM

RELATED APPLICATIONS

This application claims priority to Japanese Patent Application No. 2004-082543 filed Mar. 22, 2004 which is hereby expressly incorporated by reference herein in its entirety.

BACKGROUND

1. Technical Field

The present invention relates to ferroelectric films, methods for manufacturing ferroelectric films, ferroelectric capacitors, ferroelectric memories, and piezoelectric elements.

2. Related Art

Presently, when a ferroelectric film is formed in a semiconductor device, for example, in a ferroelectric memory (Fe-RAM), a ferroelectric film is formed in an area that is larger than a required portion, and then a patterning is conducted by using a lithography technique to leave the required portion. In this case, damages would likely be inflicted on the ferroelectric film by etching that is conducted at the time of patterning. As a result, the crystal quality of the ferroelectric capacitor may deteriorate, and troubles such as generation of a leak current may occur.

It is an object of the present invention to provide a method for manufacturing a ferroelectric film having a good crystal quality, and ferroelectric films that are obtained by the manufacturing method.

It is another object of the present invention to provide ferroelectric capacitors, ferroelectric memories and piezoelectric elements, to which a ferroelectric film in accordance with the present invention is applied.

SUMMARY

A method for manufacturing a ferroelectric film in accordance with the present invention includes the steps of: causing, in a solution containing sol-gel raw materials, hydrolysis and polycondensation to the sol-gel raw materials to form a liquid containing particulate gels dispersed therein; and forming a ferroelectric film by a migration electrodeposition method, using the liquid containing particulate gels, through electrodepositing the particulate gels on an electrode.

According to the method for manufacturing a ferroelectric film, the ferroelectric film can be formed by electrodepositing particulate gels on an electrode by a migration electrodeposition method. In other words, the ferroelectric film can be formed only on the surface of the electrode. Accordingly, the ferroelectric film can be selectively grown.

Because a ferroelectric film can be selectively formed in this manner, a patterning step which was necessary in the conventional art becomes unnecessary, for example, when a ferroelectric capacitor or the like is manufactured. As a result, damages, which may be generated in a patterning step, are not generated in a ferroelectric film, such that the ferroelectric film can be formed with a good crystal quality.

Furthermore, according to the method for manufacturing a ferroelectric film in accordance with the present invention, a liquid containing particulate gels obtained by hydrolysis and polycondensation of sol-gel raw materials in a solution containing the sol-gel raw materials can be directly used as a liquid to be used in a migration electrodeposition method.

Accordingly, a liquid for a migration electrodeposition method can be obtained without requiring a complex preparation.

In the method for manufacturing a ferroelectric film in accordance with the present invention can further include the step of heat-treating the ferroelectric film. By such a heat-treatment, the ferroelectric film can be sufficiently crystallized when it is in an amorphous state or has a low crystallinity.

In the method for manufacturing a ferroelectric film in accordance with the present invention, a ferroelectric initial core layer may be formed on the electrode beforehand.

According to the method for manufacturing a ferroelectric film, a ferroelectric initial core layer having good crystallinity and orientation is formed first by using a hydrothermal electrodeposition method. Then, the ferroelectric film is formed by using a migration electrodeposition method. When a heat-treatment is conducted later, because of the presence of the ferroelectric initial core layer having good crystallinity and orientation, the ferroelectric film crystallizes while succeeding the crystallinity and orientation. As a result, the ferroelectric film can be obtained with more excellent crystallinity and orientation, compared to the case where a ferroelectric initial core layer is not formed.

In the method for manufacturing a ferroelectric film in accordance with the present invention, the ferroelectric initial core layer may be formed in islands.

In the method for manufacturing a ferroelectric film in accordance with the present invention, the step of forming the particulate gels may use an acid or basic catalyst.

A ferroelectric film in accordance with the present invention may be manufactured by the method for manufacturing a ferroelectric film in accordance with the present invention.

A ferroelectric capacitor in accordance with the present invention may have the ferroelectric film in accordance with the present invention.

A ferroelectric memory in accordance with the present invention may have the ferroelectric film in accordance with the present invention.

A piezoelectric element in accordance with the present invention may have the ferroelectric film in accordance with the present invention.

DETAILED DESCRIPTION

Preferred embodiments of the present invention are described with reference to the accompanying drawings.

1. Method for Manufacturing Ferroelectric Film

Figure 1:
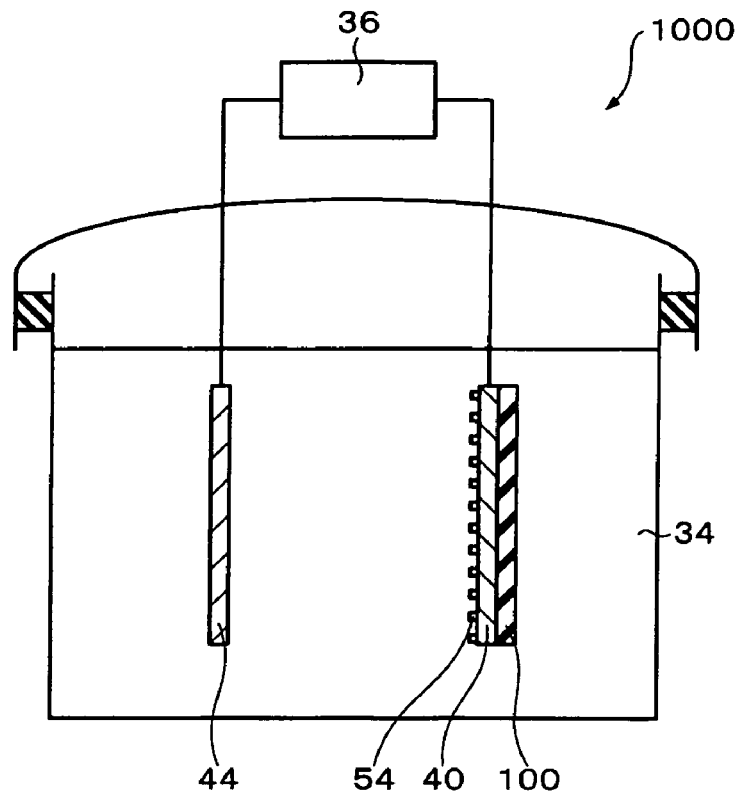
FIG. 1 is a figure schematically showing a method for manufacturing a ferroelectric film in accordance with an embodiment of the present invention.
Figure 2:
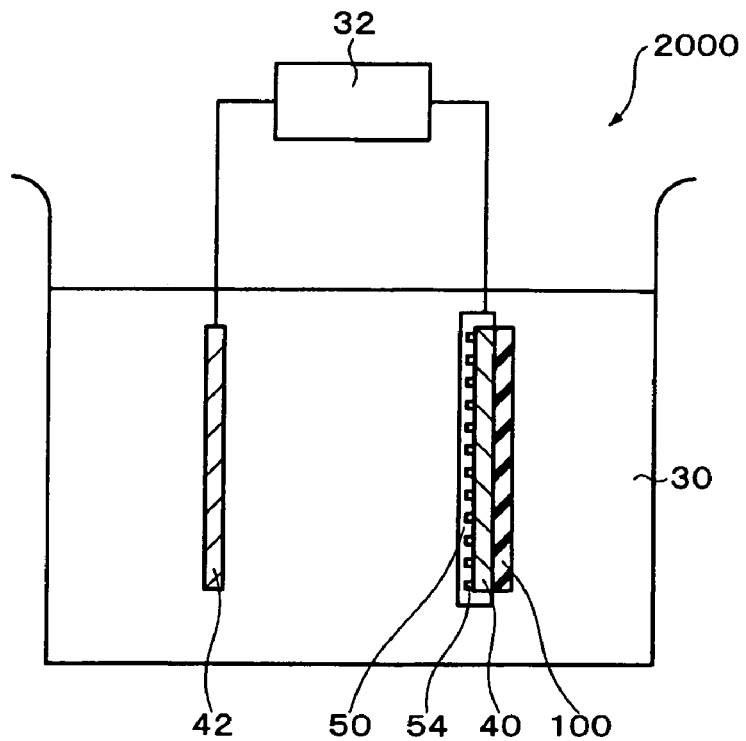
FIG. 2 is a figure schematically showing a method for manufacturing a ferroelectric film in accordance with an embodiment of the present invention.
Figure 3:
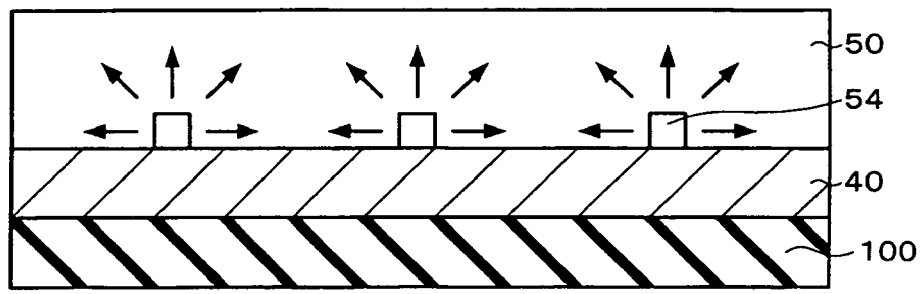
FIG. 3 is a figure schematically showing a method for manufacturing a ferroelectric film in accordance with an embodiment of the present invention.

A method for manufacturing a ferroelectric film in accordance with an embodiment of the present invention is described. FIGS. 1-3 are diagrams schematically showing a method for manufacturing a ferroelectric film in accordance with the present embodiment. A ferroelectric film may not be particularly limited to any type, and may be a ferroelectric film having a perovskite structure (for example, a PbZrTiO system), a ferroelectric film having a layered perovskite structure (for example, a BiLaTiO system, BiTiO system, and SrBiTaO system), or the like.

(a) First, by using a hydrothermal deposition method, a ferroelectric initial core layer is formed. More specifically, the following is conducted.

A solution 34 including at least ferroelectric materials which is to be used for a hydrothermal deposition method (see FIG. 1) is formed. The ferroelectric materials are ionized in the solution 34.

For example, as the ferroelectric raw material, $Pb(OH)_2$, $ZrOCl_2$, and $TiO_2$ can be used for a PbZrTiO system. In this case, the solution 34 includes $Pb^{2+}$, $Zr^{4+}$, and $Ti^{4+}$ ions Concentrations of the ions $Pb^{2+}$, $Zr^{4+}$ and $Ti^{4+}$ are, for example, about 0.5 mol/L, about 0.2 mol/L, and about 0.3 mol/L, respectively.

The following ferroelectric materials can be used. In the case of a BiLaTiO system, for example, as a Bi raw material, $Bi_2O_3$, $C_3H_9Bi$, or $C_{24}H_{45}BiO_6$ can be used; as a La raw material, $La_2O_3$, $C_9H_{21}O_6La$, or $C_{18}H_{54}N_3LaSi_6$ can be used; and as a Ti raw material, $TiO_2$, $C_{16}H_{30}O_6Ti$, or $C_8H_{24}N_4Ti$ can be used. In this case, the solution 34 includes $Bi^{3+}$, $La^{3+}$, and $Ti^{4+}$ ions. In the case of a BiTiO system, for example, as a Bi raw material, $Bi_2O_3$, $C_3H_9Bi$, or $C_{24}H_{45}BiO_6$ can be used; and as a Ti raw material, $TiO_2$, $C_{16}H_{30}O_6Ti$, or $C_8H_{24}N_4Ti$ can be used. In this case, the solution 34 includes $Bi^{3+}$ and $Ti^{4+}$ ions. In the case of a SrBiTaO system, for example, as a Sr raw material, $Sr_2O_3$, $C_6H_{14}O_2Sr$, $C_8H_{18}O_4Sr$, or $C_{22}H_{38}O_4Sr$ can be used; as a Bi raw material, $Bi_2O_3$, $C_3H_9Bi$, or $C_{24}H_{45}BiO_6$ can be used; and as a Ta raw material, $Ta_2O_5$, $C_{20}H_{45}O_5Ta$, $C_{10}H_{25}O_5Ta$, or the like can be used. In this case, the solution 34 includes $Sr^{3+}$, $Bi^{3+}$, and $Ta^{5+}$ ions.

For example, a potassium hydroxide solution or a sodium hydroxide solution can be used as the solution 34. When a potassium hydroxide solution is used as the solution 34, its pH value may vary depending on the kind of the ferroelectric film, but may be, for example, about 10-12, in view of compositions of a ferroelectric initial core layer to be formed.

Next, as shown in FIG. 1, a first electrode 40 and a second electrode 44 of a hydrothermal electrodeposition apparatus 1000 are dipped in the solution 34. As the first electrode 40, for example, platinum, silver, nickel, SRO ($SrRuO_3$), or the like can be used. The first electrode 40 is formed on a base substrate 100. For example, glass, plastic, silicon, or the like can be used as the base substrate 100. For example, platinum, silver, nickel, or the like can be used as the second electrode 44.

Next, the solution 34 is heated to a desired temperature. For example, when a potassium hydroxide solution is used as the solution 34, the desired temperature may be, for example, about 50-180° C., in view of compositions of a ferroelectric initial core layer to be formed, although it may differ depending on the kind of the ferroelectric film.

In the hydrothermal electrodeposition method, the composition ratio of a ferroelectric initial core layer 54 can be controlled by adjusting pH and the temperature of the solution 34. For example, when a ferroelectric initial core layer 54 of a PbZrTiO system is formed, a potassium hydroxide solution of pH12 may preferably be used as the solution 34, and its temperature may be set to 110° C. By so doing, the ferroelectric initial core layer 54 can be made to have a composition of Pb:Zr:Ti=10:2:8.

Next, a desired voltage is impressed between the first electrode 40 and the second electrode 44 by using a power supply 36. The desired voltage is, for example, 0.5-2V, in view of the crystallinity and orientation of the ferroelectric initial core layer 54. By using a voltage at this level, the ferroelectric initial core layer 54 is formed while a sufficient time is spent so that its crystallinity and orientation become excellent.

In this step, the ionized ferroelectric raw materials precipitate to the surface of the first electrode 40 through migration, and the ferroelectric initial core layer 54 is formed on the surface of the first electrode 40. The ferroelectric initial core layer 54 may preferably be formed to lie scattered in islands. By forming the ferroelectric initial core layer 54 to lie scattered in islands, the ferroelectric initial core layer 54 which is an insulator would not entirely cover the surface of the first electrode 40. Accordingly, when a migration electrodeposition method to be described later is used, an electric field can be generated between electrode plates in the migration electrodeposition apparatus, and migration electrodeposition can be conducted. The thickness of the ferroelectric initial core layer 54 is a thickness with which the ferroelectric initial core layer 54 becomes to be in the state of islands, and, for example, several nm—about 20 nm.

According to the above-described hydrothermal electrodeposition method, the ferroelectric initial core layer 54 is formed to have good crystallinity and orientation.

(b) Next, a liquid containing particular gels (hereafter referred to as a "particulate gel dispersed liquid") that is used for a migration electrodeposition method to be described is prepared.

The particulate gel dispersed liquid can be obtained by using a solution containing sol-gel materials, and causing hydrolysis and polycondensation of the sol-gel materials under conditions to form particulate gels in the solution.

As the sol-gel raw materials, well-known materials, such as, a material containing an alkoxide of a metal, an organic acid salt of a metal, an inorganic salt of a metal or the like dissolved in an organic solvent such as alcohol may be used, without any particular limitation. By adding water, or an acid or basic catalyst if necessary, and a solvent to these sol-gel raw materials, the sol-get raw materials undergo hydrolysis and polycondensation, such that the particulate gel dispersed solution can be obtained.

In this instance, the present invention is characterized in that hydrolysis and polycondensation are progressed from ordinary sol-gel film forming raw materials to thereby extract particulate gels in the solvent. Ordinarily, sol-gel film forming materials, which are used in a spin coat method, dipping method, spray method or the like, need to be in a stable liquid. Therefore a consideration is given so as not to generate particulate gels, and a stabilizing agent is added to prevent progress of the reaction. In contrast, in accordance with the present invention, hydrolysis and polycondensation of the sol-gel raw materials are progressed from ordinary sol-gel film forming materials. For example, by forming three-dimensional polymer condensation materials, particulate gels are positively generated by cohesion of such polymers.

As the catalyst, though it is not especially limited, a catalyst that can obtain three-dimensional polymers composing particulate gels through hydrolysis and polycondensation can be used. For example, when a metal alkoxide is used as the sol-gel raw material, a basic catalyst can be used. When an organic acid salt of a metal (for example, acetate) is used as the sol-gel raw material, an acid catalyst can be used. As the aforementioned basic catalyst, 2-aminoethanol, 2-dimethylaminoethanol, 2-diethylaminoethanol, 4-amino-1-butanol or the like can be used. As the aforementioned acid catalyst, citric acid, malic acid, succinic acid, picric acid, methyl citrate, dimethyl succinate, diethyl succinate or the like can be used.

As the solvent, although it may not be particularly limited, methanol, ethanol, n-buthanol, or the like can be used, considering that the particulate gels formed through hydrolysis and polycondensation can stably exist therein.

The particulate gels have —M—O— bonds (M: metal), wherein metal atoms have positive charge, and oxygen atoms have negative charge. Accordingly, the particulate gel dispersed liquid containing such particulate gels can be applied to the following migration electrodeposition method. The size of particulate gels is not particularly limited, but may be 20-500 nm, in view of dispersing stability of the particulate gel dispersed liquid, and migration of the particulate gels in the migration electrodeposition method.

(c) Next, a ferroelectric film is formed by a migration electrodeposition method. Concretely, the following is conducted.

First, a first electrode 40 and a third electrode 42 of a migration electrodeposition apparatus 2000 are dipped in a particulate gel dispersed liquid 30 containing particulate gels, as shown in FIG. 2. The ferroelectric initial core layer 54 has been formed on the first electrode 40 in the step (a). Next, a voltage is impressed by using a power supply 32 between the first electrode 40 and the third electrode 42, whereby the particulate gels having charges precipitate to the surface of the first electrode 40 through migration. As a result, a ferroelectric film 50 is formed on the surface of the first electrode 40. The ferroelectric film 50 is formed in a manner to cover the ferroelectric initial core layer 54.

In the migration electrodeposition method described above, ionized particles are deposited, such that the film forming rate is high, and therefore the ferroelectric film 50 can be formed into a thick film in a short time. The ferroelectric film formed in this process consists of particulate gels deposited through electrodeposition, and has a state of amorphous or polycrystal.

In the migration electrodeposition method, the first electrode 40 is a cathode, when the particulate gels have positive potential, for example. In reverse, when the particulate gels have negative potential, the first electrode 40 is an anode. As the third electrode 42, for example, platinum, silver, nickel or the like can be used. The positive or negative potential of the particulate gels is decided by a zeta-potential in the solvent. Each material has its characteristic potential, and the particulate gels also change their apparent potential by the state of the surrounding solvent. This apparent potential is called a zeta-potential. Therefore, if the zeta-potential of the particulate gels is a positive potential in the solvent, the particulate gels migrate toward the cathode, and if the zeta-potential of the particulate gels is a negative potential in the solvent, the particulate gels migrate toward the anode.

(d) Next, by heat-treating the ferroelectric film, the ferroelectric film is crystallized. This heat-treatment is conducted to crystallize the ferroelectric film in an amorphous state or polycrystal state obtained in the step (c) described above.

When the ferroelectric film is crystallized, because of the existence of the ferroelectric initial core layer 54 formed on the first electrode 40 having excellent crystallinity and orientation, as shown in FIG. 3, the ferroelectric film 50 is also crystallized, while succeeding the crystallinity of orientation of the ferroelectric initial core layer 54. As a result, the ferroelectric film can be obtained with excellent crystallinity and orientation. Arrows in FIG. 3 schematically indicate the state in which the ferroelectric film 50 succeeds, upon its crystallization, the crystallinity and orientation from the ferroelectric initial core layer 54.

The heat-treatment temperature depends on the crystal state of the ferroelectric film obtained in the above-described step (c). For example, when the ferroelectric film is in an amorphous state, a ferroelectric film having excellent crystallinity and orientation can be obtained even when the heat-treatment temperature is set to a low temperature, compared to the case where the ferroelectric film is in a polycrystal state. When the ferroelectric film is in an amorphous state, the temperature of heat-treatment, though it differs depending on the kind of the ferroelectric film, may be 450-650° C., for example. When the ferroelectric film is in a polycrystal state, the temperature of heat-treatment, though it differs depending on the kind of the ferroelectric film, may be 150-450° C., for example. The heat-treatment can be conducted by a known method, such as, for example, RTA or the like.

By the steps described above, the ferroelectric film can be manufactured. According to the method for manufacturing a ferroelectric film, the following characteristics can be obtained.

According to the method for manufacturing a ferroelectric film in accordance with the present embodiment, first, the ferroelectric initial core layer 54 having good crystallinity and orientation is formed by using a hydrothermal electrodeposition method. Then, the ferroelectric film 50 is formed by using a migration electrodeposition method. When a heat-treatment is conducted later, because of the presence of the ferroelectric initial core layer 54 having good crystallinity and orientation, the ferroelectric film 50 also succeeds the crystallinity and orientation and crystallizes. As a result, the ferroelectric film can be obtained with excellent crystallinity and orientation.

Furthermore, according to the method for manufacturing a ferroelectric film in accordance with the present embodiment, a particulate gel dispersed liquid obtained by hydrolysis and polycondensation of sol-gel raw materials in a solution containing the sol-gel raw materials can be directly used as a liquid to be used in a migration electrodeposition method. Accordingly, a liquid for a migration electrodeposition method can be obtained without requiring a complex preparation.

It is generally known that, in the sol-gel method, metal atoms forming a target oxide are regularly aligned via oxygen atoms, and form so-called networks, whereby the crystallization temperature lowers. Because particulate gels succeed the same characteristics, the crystallization temperature lowering effect was confirmed. In the case of ordinary migration electrodeposition, it is a general practice to add single metals or single oxide materials to corresponding solvents, separately, such that the zeta-potentials of the respective materials are different from one another, and therefore it is difficult to obtain a thin film having a target composition (composition ratio of atoms). However, in accordance with the present invention, constituting elements are already in a state in which they are connected together in networks at a target element composition ratio, thereby forming particulate gels, and a thin film is formed by using the zeta-potential of the particles themselves, such that the control of compositions is easy.

According to the method for manufacturing a ferroelectric film in accordance with the present embodiment, a migration electrodeposition method that achieves a high film forming rate is used, such that a ferroelectric film can be formed to a thick film in a short time.

Also, according to the method for manufacturing a ferroelectric film in accordance with the present embodiment, a hydrothermal electrodeposition method and a migration electrodeposition method are used, such that the ferroelectric film 50 is electrodeposited and formed on the first electrode 40. In other words, the ferroelectric film 50 can be formed only on the surface of the first electrode 40. Accordingly, the ferroelectric film 50 can be selectively grown. Furthermore, because the ferroelectric film 50 is crystallized by conducting a heat-treatment, the ferroelectric film can be selectively formed.

Because a ferroelectric film can be selectively formed in this manner, a patterning step which was necessary in the conventional art becomes unnecessary, for example, when a ferroelectric capacitor or the like is manufactured. As a result, damages, which may be caused in a patterning step, are not generated in a ferroelectric film, such that the ferroelectric film can be formed with a good crystal quality, and for example, a ferroelectric capacitor having excellent characteristics can be realized. Also, because a patterning step is not necessary, for example, a ferroelectric capacitor can be formed with a simple process. Concretely, a ferroelectric capacitor may be formed as follows.

First, a first electrode 40 is formed on a base substrate 100 by a known method. The first electrode 40 defines a lower electrode in a ferroelectric capacitor. Next, by applying the manufacturing method in accordance with the present invention, a ferroelectric film is formed on a surface of the first electrode 40. Next, by using a known method, an upper electrode in the ferroelectric capacitor is formed on the ferroelectric film. Opposing surfaces of the lower electrode and the upper electrode and the ferroelectric film disposed between them compose a ferroelectric capacitor.

A detailed embodiment example of the manufacturing method in accordance with an embodiment of the present invention is described below.

2. Embodiment Example

In accordance with the embodiment example, a PbZrTiO system (hereafter referred to as "PZT system") ferroelectric film was manufactured.

First, ferroelectric raw materials of the PZT system, $Pb(OH)_2$, $ZrOCl_2$, and $TiO_2$ were dissolved to a potassium hydroxide solution. The potassium hydroxide solution was adjusted to become pH12. Next, by using a hydrothermal electrodeposition apparatus, the potassium hydroxide solution containing the ferroelectric raw materials dissolved therein was heated to about 110° C., and a voltage of about 1V was impressed across the electrodes. Then, a PZT system ferroelectric initial core layer having a film thickness of about 20 nm was formed on a cathode plate in islands. The film forming rate was about 20 nm/1 day. SRO was used as the cathode plate and platinum was used as an anode plate.

Next, dimethyl succinate was added to a PZT sol-gel solution of a concentration of 10 weight % in 1:1 by weight ratio, whereby a particulate gel dispersed liquid containing spherical gels having a particle size of about 100 nm generated therein was obtained. The PZT sol-gel solution used a butanol solvent, and the sol-gel solution with Pb/Zr/Ti composition being 105/20/80 was used.

In the obtained particulate gel dispersed liquid (n buthanol solution), an electric field of 400 V is impressed, whereby a PZT film was formed to a film thickness of 130 nm in 5 minutes on an electrode used as the cathode plate on which the ferroelectric initial core layer was formed. The PZT film was in an amorphous state. Further, sintering was conducted by RTA at 650° C., whereby a single layer of crystallized PZT film was obtained.

Figure 7A:
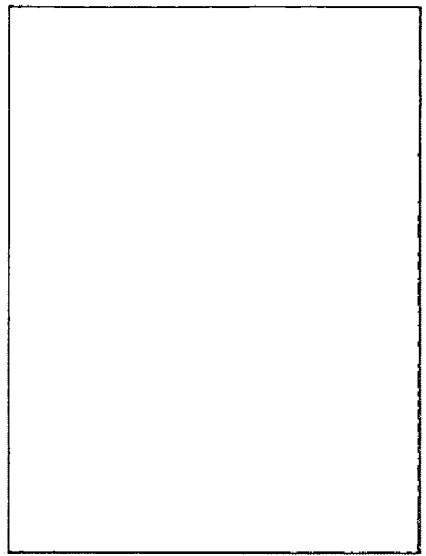
FIG. 7(A)-(C) are microphotographs showing the state of generation of particulate gels in accordance with embodiment examples.
Figure 7B:
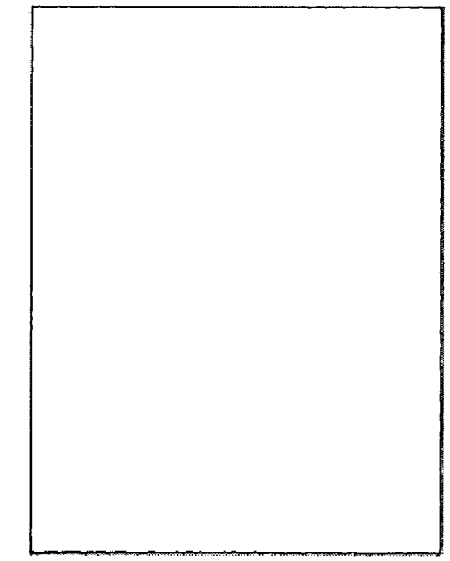
Figure 7C:
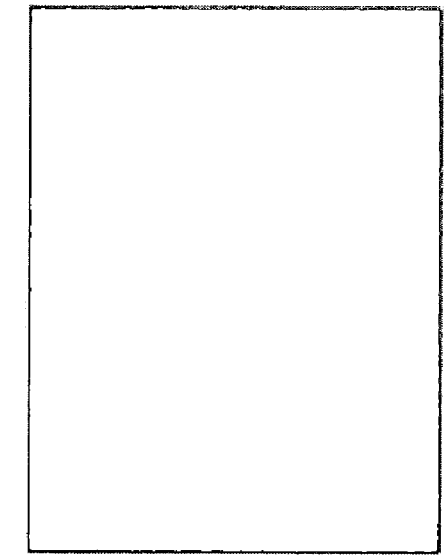

FIGS. 7(A)-(C) are microphotographs showing that the generation states of particulate gels differ depending on the amount of catalyst added. More specifically, FIG. 7(B) indicates the case when the weight ratio of a PZT sol-get solution and dimethyl succinate (DMS) is 60:40, and it was found that many particulate gels having a grain size of about 20 nm were generated. FIG. 7(C) indicates the case (the example described above) when the weight ratio of a PZT sol-get solution and dimethyl succinate (DMS) is 50:50, and it was found that particulate gels having a grain size of about 100 nm were generated. In view of the above, it was confirmed that by regulating the kind and amount of catalyst, for example, a particulate gel dispersed liquid to be used in the present invention could be obtained.

Figure 8:
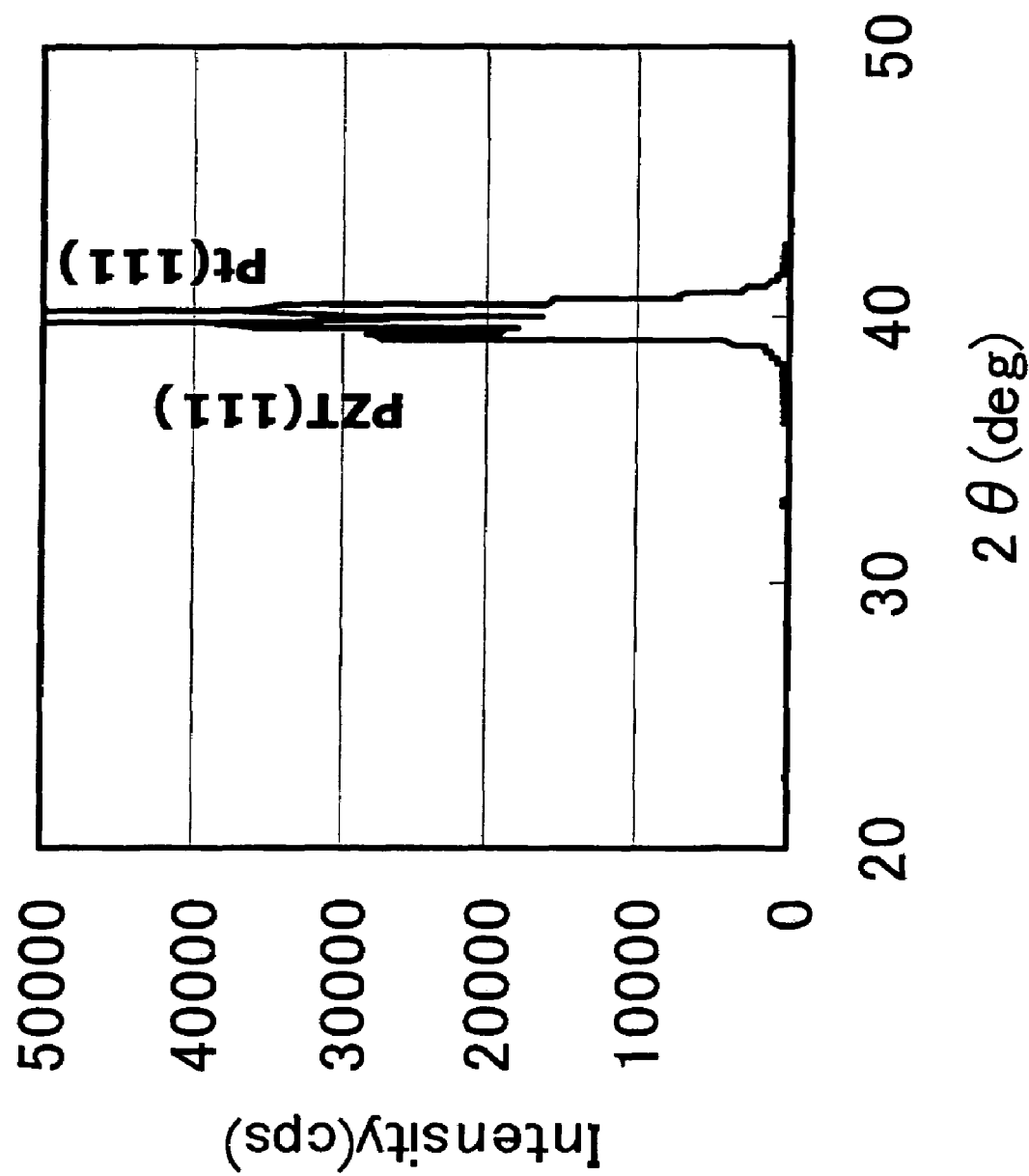
FIG. 8 is a graph showing an XRD pattern of a ferroelectric film in accordance with an embodiment example.

FIG. 8 is a diagram showing an XRD pattern of a crystallized single-layer PZT film obtained in accordance with the present embodiment example. It was confirmed from the XRD pattern that the PZT film in accordance with the present embodiment example was a ferroelectric film having a (111) orientation.

3. Ferroelectric Memory and Other Application Examples

The method for manufacturing a ferroelectric film in accordance with the present embodiment can be applied to a method for manufacturing a ferroelectric memory, a piezoelectric element or the like which uses the ferroelectric film. The method for manufacturing a ferroelectric film in accordance with the present embodiment is applied as an example to a method for manufacturing a simple matrix type (crosspoint type) ferroelectric memory, and the method is described below.

Figure 4:
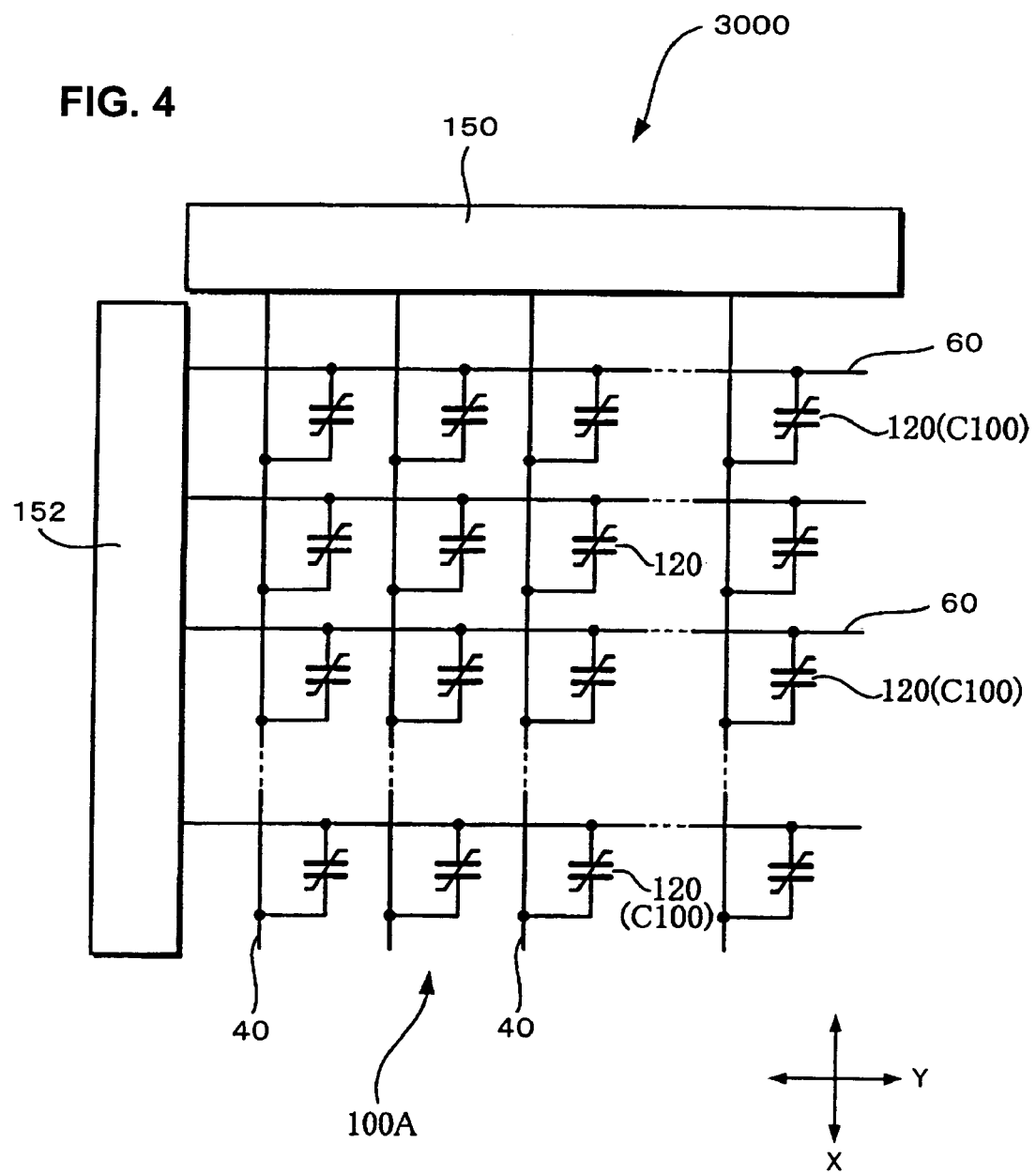
FIG. 4 is a plan view schematically showing a ferroelectric memory in accordance with an embodiment of the present invention.
Figure 5:
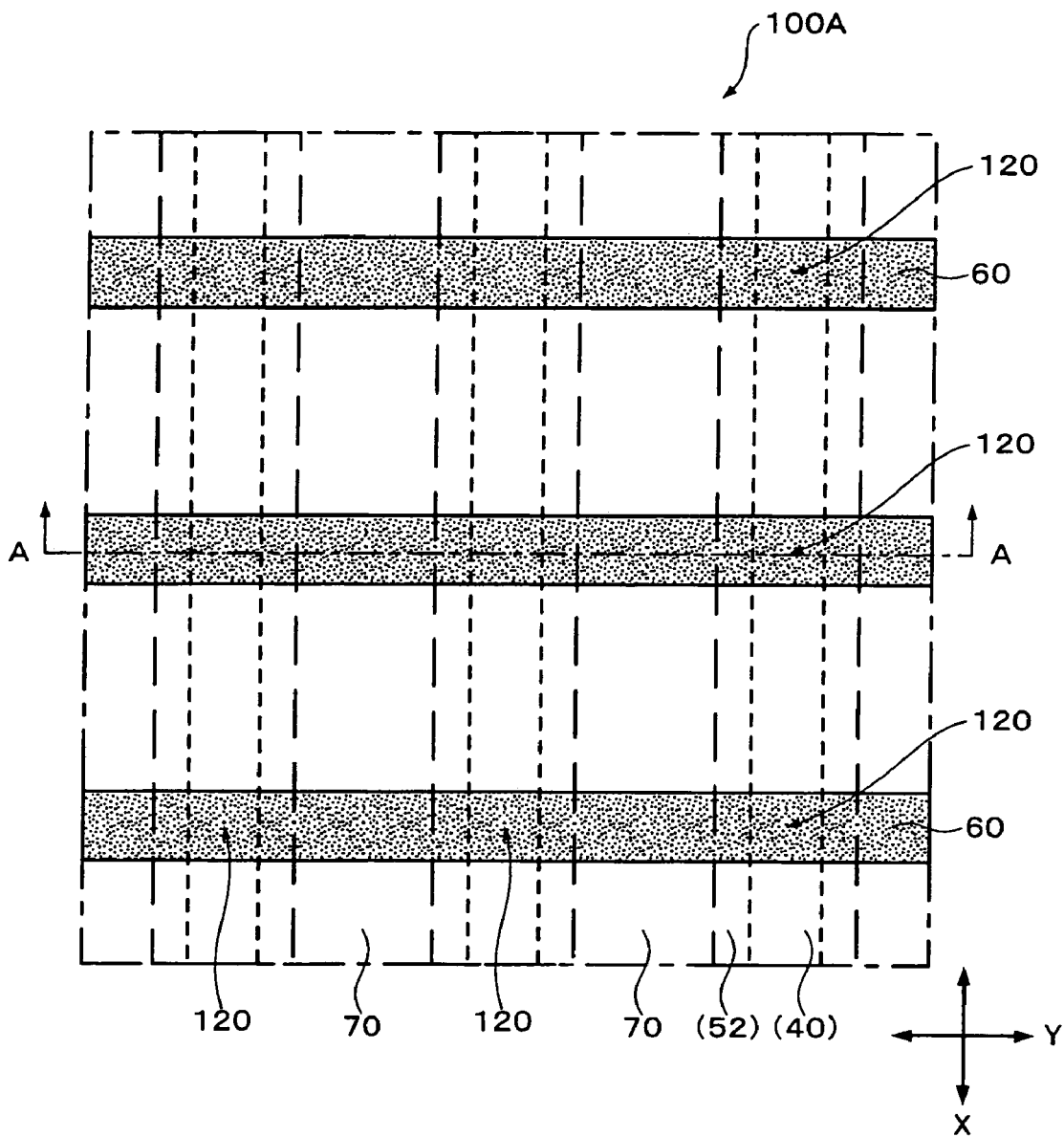
FIG. 5 is a plan view schematically showing a ferroelectric memory in accordance with an embodiment of the present invention.
Figure 6:
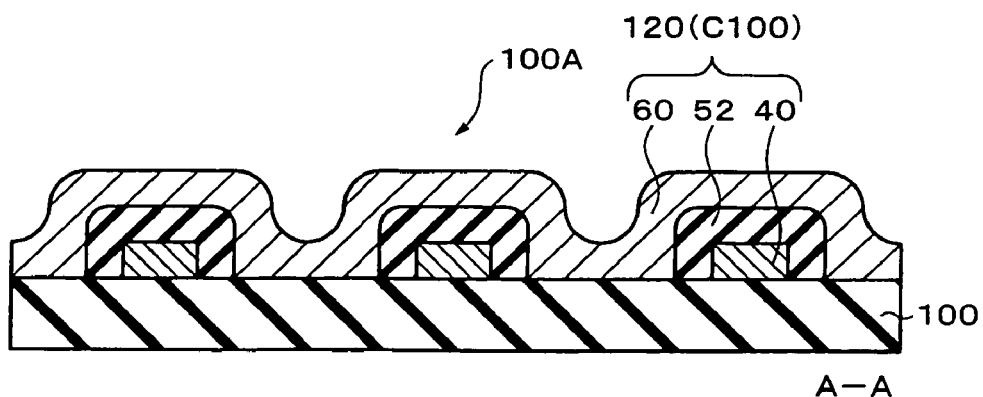
FIG. 6 is a cross-sectional view schematically showing a ferroelectric memory in accordance with an embodiment of the present invention.

FIG. 4 is a diagram schematically showing a ferroelectric memory, FIG. 5 is an enlarged plan view showing a part of a memory cell array, and FIG. 6 is a cross-sectional view taken along a line A-A of FIG. 5. In the plan view, numbers in parentheses indicate layers below the topmost layer.

A ferroelectric memory 3000 of this example, as shown in FIG. 4, includes a memory cell array 100A in which memory cells 120 are arranged in a simple matrix configuration, and various circuits that selectively write and read information in and from the memory cells 120 (ferroelectric capacitors C100) including, for example, a first drive circuit 150 that selectively controls first signal electrodes 40 (first electrodes), a second drive circuit 152 that selectively controls second signal electrodes 60, a signal detection circuit such as sense amplifiers (not shown) and the like.

In the memory cell array 100A, the first signal electrodes (word lines) 40 for line selection and the second signal electrodes 60 (bit lines) for column selection are arranged perpendicular to one another. More specifically, the first signal electrodes 40 are arranged at a prescribed pitch along a direction X, and the second signal electrodes 60 are arranged at a prescribed pitch along a direction Y orthogonal to the direction X. It is noted that the signal lines may be inverted to the above, so that the first signal electrodes are bit lines, and the second signal electrodes are word lines.

In the memory cell array 100A in accordance with the present embodiment, as shown in FIG. 5 and FIG. 6, the first signal electrode 40, the ferroelectric film 52 manufactured according to the manufacturing method of the present invention, and the second signal electrode 60 are laminated on an insulating base substrate 100, whereby a ferroelectric capacitor 120 is formed by the first signal electrode 40, the ferroelectric film 52 and the second signal electrode 60. More specifically, the ferroelectric film 52 is formed on the first electrode (first signal electrode) 40 by applying the manufacturing method in accordance with the present invention, as follows.

First, first electrodes (first signal electrodes) 40 are formed in parallel stripes along a direction X on a base substrate 100. The first electrodes 40 compose first signal electrodes 40 in a ferroelectric memory. Next, a ferroelectric film 52 is formed by using a hydrothermal electrodeposition method and a migration electrodeposition method on the first signal electrodes 40. Next, second signal electrodes 60 are formed in parallel stripes along a direction Y on the ferroelectric film 52 by a known method. In intersecting areas of the first signal electrodes 40 and the second signal electrodes 60, memory cells composed of ferroelectric capacitors 120 are formed, respectively.

A dielectric layer 70 is formed in a manner to cover exposed faces of base substrate 100 and the first signal electrodes 40 between laminated bodies of the ferroelectric films 52 and the second electrodes 60. The dielectric layer 70 may preferably have a smaller dielectric constant compared to the ferroelectric film 52. By placing the dielectric layer 70 having a smaller dielectric constant than that of the ferroelectric film 52 between the laminated bodies of the ferroelectric films 52 and the second electrodes 60, stray capacitances of the first and second signal electrodes 40 and 60 can be made smaller. As a result, writing and reading operations of the ferroelectric memory 3000 can be performed at higher speeds.

Next, an example of wiring and reading operations in the ferroelectric memory 3000 is described.

First, in a reading operation, a read voltage "$V_0$" is impressed to a capacitor of each selected cell. This at the same time serves a writing operation to write "0." At this moment, a current that flows in a selected bit line or a potential on the bit line that is brought to a high impedance is read out by a sense amplifier. In addition, at the same time, a predetermined voltage is impressed to capacitors of non-selected cells in order to prevent cross-talk at the time of reading.

In a writing operation, in the case of writing "1," a voltage "$-V_0$" is impressed to a capacitor of each selected cell. In the case of writing "0," a voltage that does not reverse the polarization of a selected cell is impressed to a capacitor of each selected cell, to maintain a "0" state written in the reading operation. At this moment, a predetermined voltage is impressed to capacitors of non-selected cells in order to prevent cross-talk at the time of writing.

Because a ferroelectric memory in accordance with the present invention has a ferroelectric capacitor including a ferroelectric film having an excellent crystal structure, highly reliable ferroelectric memories can be provided.

Though an example of a simple matrix type ferroelectric film is described above, the ferroelectric memory of the present invention is not limited to the example, and is also applicable to memory transistors of other types. A ferroelectric capacitor in accordance with the present embodiment can be applied not only to the ferroelectric memory described above, but also to pyroelectric type sensors, bimorph type piezoelectric actuators, and the like.

Though examples of embodiments of the present invention are described above, the present invention is not limited to them, and a variety of modes can be implemented within the range of the subject matter. For example, in accordance with the present invention, a ferroelectric initial core layer does not have to be formed on an electrode beforehand. In this case, the step (a) is not conducted in the method for manufacturing a ferroelectric film described above.

What is claimed is:

1. A method for manufacturing a ferroelectric film, comprising the steps of:
   forming a ferroelectric initial core layer on an electrode;
   causing, in a solution containing sol-gel raw materials, hydrolysis and polycondensation to the sol-gel raw materials to form a liquid containing particulate gels dispersed therein; and
   forming a ferroelectric film on said ferroelectric initial core layer by a migration electrodeposition method, using the liquid containing particulate gels, through electrodepositing the particulate gels on said electrode.

2. A method for manufacturing a ferroelectric film according to claim 1, further comprising the step of heat-treating the ferroelectric film.

3. A method for manufacturing a ferroelectric film according to claim 1, wherein the ferroelectric initial core layer is formed on the electrode by a hydrothermal electrodeposition method, using a solution of ferroelectric raw materials.

4. A method for manufacturing a ferroelectric film according to claim 1, wherein the ferroelectric initial core layer is formed in islands.

5. A method for manufacturing a ferroelectric film according to claim 1, wherein the step of forming the particulate gels uses an acid or basic catalyst.

\* \* \* \* \*